US009338912B2

(12) United States Patent  
Chang et al.

(10) Patent No.: US 9,338,912 B2  
(45) Date of Patent: May 10, 2016

(54) ELECTRONIC DEVICE HOLDER

(71) Applicant: ASKEY COMPUTER CORP., New Taipei (TW)

(72) Inventors: Chih-Ming Chang, Taipei (TW); Sung-Chin Wu, Hualien County (TW)

(73) Assignee: ASKEY COMPUTER CORP., New Taipei (TW)

( * ) Notice: Subject to any disclaimer, the term of this patent is extended or adjusted under 35 U.S.C. 154(b) by 456 days.

(21) Appl. No.: 13/787,818

(22) Filed: Mar. 7, 2013

(65) Prior Publication Data

US 2014/0198433 A1 Jul. 17, 2014

(30) Foreign Application Priority Data

Jan. 11, 2013 (TW) .............................. 102101185 A

(51) Int. Cl.  
| H05K 7/00 | (2006.01) |
| F16M 11/04 | (2006.01) |
| F16M 11/14 | (2006.01) |
| F16M 13/00 | (2006.01) |
| H04M 1/04 | (2006.01) |
| G06F 1/16 | (2006.01) |

(52) U.S. Cl.  
CPC .............. *H05K 7/00* (2013.01); *F16M 11/041* (2013.01); *F16M 11/14* (2013.01); *F16M 13/00* (2013.01); *H04M 1/04* (2013.01); *G06F 1/1632* (2013.01)

(58) Field of Classification Search  
CPC ................. B60R 11/0241; B60R 2011/0071; H04M 1/04; H04M 1/0262; H04M 1/0283; H04B 1/3877; H04B 1/3883; H05K 7/00; H05K 7/10; H05K 7/103; F16M 11/041; F16M 11/14; F16M 13/00; G06F 1/1632

USPC ................... 224/930; 455/569.2, 569.1, 573; 361/679.01

See application file for complete search history.

(56) References Cited

U.S. PATENT DOCUMENTS

| 8,929,065 | B2* | 1/2015 | Williams | G06F 1/1632 361/679.41 |
| 2003/0083115 | A1* | 5/2003 | Kato | H04B 1/3877 455/573 |
| 2008/0002354 | A1* | 1/2008 | Carnevali | G06F 1/1632 361/679.41 |
| 2008/0270664 | A1* | 10/2008 | Carnevali | G06F 1/1632 710/303 |
| 2009/0212189 | A1* | 8/2009 | Carnevali | B25B 5/02 248/346.04 |
| 2009/0213536 | A1* | 8/2009 | Lewandowski | G06F 1/1632 361/679.43 |
| 2012/0329532 | A1* | 12/2012 | Ko | H04B 1/3888 455/573 |
| 2014/0094227 | A1* | 4/2014 | Hu | G06F 1/1628 455/566 |
| 2015/0172431 | A1* | 6/2015 | Huang | H04M 1/0283 455/556.1 |
| 2015/0263775 | A1* | 9/2015 | Vila | H04B 1/3883 455/573 |
| 2015/0301562 | A1* | 10/2015 | Williams | G06F 1/1632 361/679.43 |

* cited by examiner

*Primary Examiner* — Corey Skurdal  
(74) *Attorney, Agent, or Firm* — Jianq Chyun IP Office

(57) ABSTRACT

An electronic device holder used to be fixed on a moving carrier for holding an electronic device is provided. The electronic device holder includes a holder, a fixing element, a moving unit and at least one first connector. The fixing element fixed on the holder has a first limiting structure. The moving unit disposed between the holder and the fixing element moves relative to the holder. The moving unit has a second limiting structure used to lock with the first limiting structure for fixing the moving unit on a lock position or an open position. The first connector is disposed on the moving unit and used to connect with a second connector when the moving unit is located on the lock position relative to the holder. The electronic device holder integrates functions of holding and charging for the electronic device.

8 Claims, 6 Drawing Sheets

ELECTRONIC DEVICE HOLDER

CROSS-REFERENCE TO RELATED APPLICATION

This application claims the priority benefit of Taiwan application serial no. 102101185, filed on Jan. 11, 2013. The entirety of the above-mentioned patent application is hereby incorporated by reference herein and made a part of this specification.

BACKGROUND OF THE INVENTION

1. Field of the Invention

The invention relates to an electronic device holder, and more particularly to an electronic device holder integrating functions of holding and charging.

2. Description of Related Art

Currently, when an electronic device such as a mobile phone, portable navigation device or satellite television is intended to be fixed inside a car, a general solution is to directly engage the electronic device with a car mount. However, as publicly known, the electronic device can be very power-consuming if it is used to display a navigation screen or a television program continuously during motion of the car, and this is why a charging cable is needed for connecting to the electronic device. Nevertheless, the conventional charging cable and car mount are separate accessories. In other words, in the case the charging cable is forgotten to be brought along, the electronic device is very likely to run out of electricity and cannot be used any longer.

SUMMARY OF THE INVENTION

The invention provides an electronic device holder providing charging and holding functions at the same time.

The invention also provides an electronic device holder having a substantially different structure from the aforementioned electronic device holder.

The electronic device holder of the invention is adapted to be fixed on a moving carrier for holding an electronic device. The electronic device holder includes a holder, a fixing element, a moving unit and at least one first connector. The fixing element is fixed above a back surface of the holder and has a first limiting structure. The moving unit is disposed between the holder and the fixing element, and moves relative to the holder. The moving unit has a second limiting structure, wherein the second limiting structure locks with the first limiting structure for fixing the moving unit on a lock position or an open position. The first connector is disposed on the moving unit and is adapted to connect with a second connector of the electronic device when the moving unit is located on the lock position relative to the holder.

In an embodiment of the electronic device holder of the invention, the holder has a carrier space on a side opposite to a side where the back surface is located. The electronic device is disposed in the carrier space, wherein a connector jack of the first connector is correspondingly toward the carrier space.

In an embodiment of the electronic device holder of the invention, the first limiting structure is one of a gradational projection and an elastic piece, and the second limiting structure is the other one of the gradational projection and the elastic piece.

In an embodiment of the electronic device holder of the invention, the holder further has a plurality of protruding ribs protruding from the back surface. The moving unit has a plurality of openings, and the protruding ribs correspondingly penetrate through the openings of the moving unit. The protruding ribs and the openings are disposed in pairs. The electronic device holder further includes a plurality of fastening elements penetrating through the fixing element and fastened into the protruding ribs.

In an embodiment of the electronic device holder of the invention, the first connector includes a male connector head and a female connector head disposed on opposite sides of the moving unit. The male connector head is electrically connected to the female connector head, and the male connector head is adapted to connect with the electronic device. The electronic device holder further includes a circuit board or a flexible flat cable fixed on the moving unit. The male connector head is electrically connected to the female connector head via the circuit board or the flexible flat cable.

In an embodiment of the electronic device holder of the invention, the electronic device holder further includes a housing assembled with the moving unit.

The invention provides another electronic device holder adapted to be fixed on a moving carrier for holding an electronic device. The electronic device holder includes a holder, a fixing element, a moving unit and at least one first connector. The holder has a back surface and a first limiting structure, wherein the first limiting structure is disposed on the back surface. The moving unit is disposed on the back surface, moving relative to the holder. The moving unit has a second limiting structure, wherein the second limiting structure locks with the first limiting structure for fixing the moving unit on a lock position or an open position relative to the holder. The first connector is disposed on the moving unit and is adapted to connect with a second connector of the electronic device when the moving unit is located on the lock position relative to the holder.

In an embodiment of the electronic device holder of the invention, the holder has a carrier space on a side opposite to a side where the back surface is located. The electronic device is disposed in the carrier space, wherein a connector jack of the first connector is correspondingly toward the carrier space.

In an embodiment of the electronic device holder of the invention, the first limiting structure is one of a gradational projection and an elastic piece, and the second limiting structure is the other one of the gradational projection and the elastic piece.

In an embodiment of the electronic device holder of the invention, the holder further has a plurality of protruding ribs protruding from the back surface. The moving unit has a plurality of openings, and the protruding ribs correspondingly penetrate through the openings of the moving unit. The protruding ribs and the openings are disposed in pairs. The electronic device holder further includes a plurality of fastening elements penetrating through the fixing element and fastened into the protruding ribs.

In an embodiment of the electronic device holder of the invention, the first connector includes a male connector head and a female connector head disposed on opposite sides of the moving unit. The male connector head is electrically connected to the female connector head, and the male connector head is adapted to connect with the electronic device. The electronic device holder further includes a circuit board or a flexible flat cable fixed on the moving unit. The male connector head is electrically connected to the female connector head via the circuit board or the flexible flat cable.

In an embodiment of the electronic device holder of the invention, the electronic device holder further includes a housing assembled with the moving unit.

Based on the above, the electronic device holder of the invention integrates a holder with a connector. By utilizing the position of the moving unit relative to the holder, effects that the holder only holds the electronic device but not charge it and that the holder charges the electronic device while holding it at the same time are both achievable. Compared to the prior art in which the conventional car mount and the charging cable are two independent accessories, the electronic device holder of the invention provides convenience in use.

To make the above features and advantages of the invention more comprehensible, embodiments accompanied with drawings are described in detail as follows.

DESCRIPTION OF EMBODIMENTS

Figure 1:
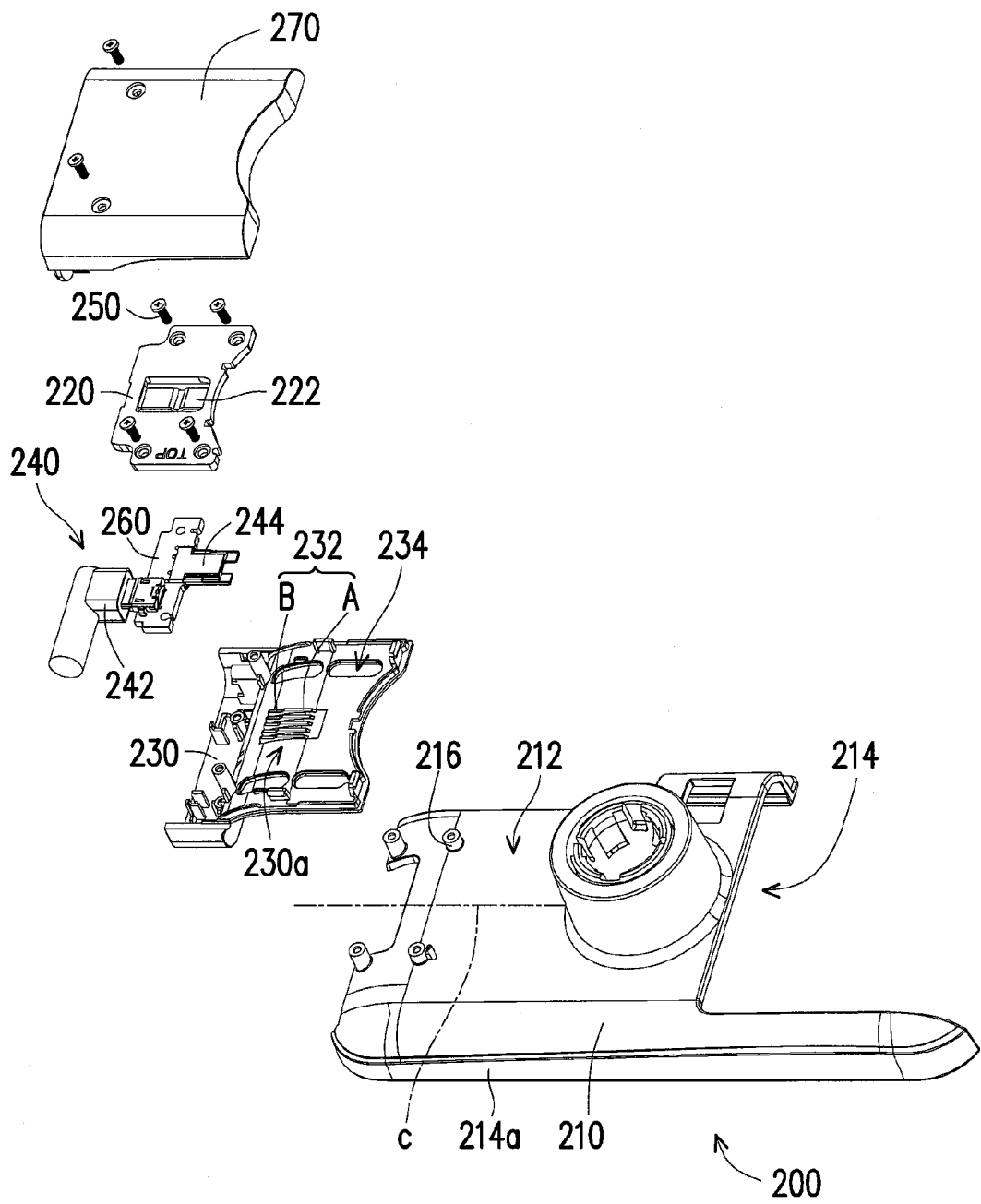
FIG. 1 and FIG. 2 are schematic exploded diagrams of an electronic device holder of the invention from different view angles.

The invention is described more fully hereinafter with reference to the accompanying drawings, in which the embodiments of the invention are shown. The invention may, however, be embodied in many different forms and should not be construed as limited to the embodiments set forth herein. Rather, these embodiments are provided so that this disclosure will be thorough and complete, and will fully convey the scope of the invention to persons of ordinary skill in the art. In the drawings, the thicknesses of layers and regions may be exaggerated for clarity, illustration, and convenience, thus not corresponding to real proportions, while still falling within the spirit of the embodiments of the invention. In addition, the same reference numerals in the drawings denote the same elements, and descriptions thereof will not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g. "between" versus "directly between," "adjacent" versus "directly adjacent," "above" versus "directly above," etc.).

It will be understood that, although the terms "first," "second," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the embodiments.

Spatially relative terms, such as "beneath", "below", "lower", "under", "above," "upper," "over" and the like, may be used herein for ease of description to describe one element or structural feature's relationship to another element(s) or structural feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" or "under" other elements or structural features would then be oriented "above" or "over" the other elements or structural features. Thus, the exemplary terms "below" and "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated structural features, integers, steps, operations, elements, and/or components, but do not preclude the presence or addition of one or more other structural features, integers, steps, operations, elements, components, and/or groups thereof.

Figure 2:
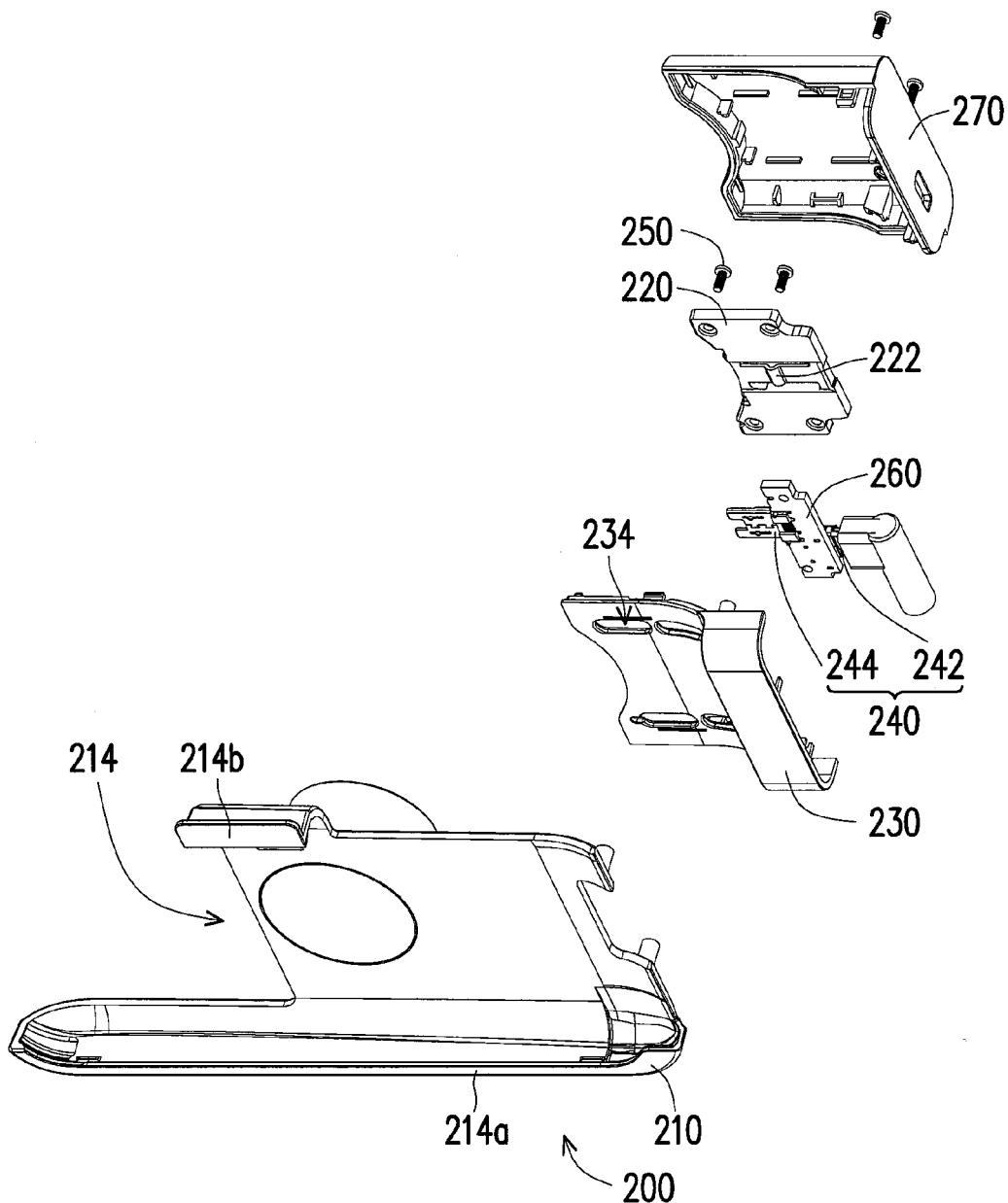
Figure 3:
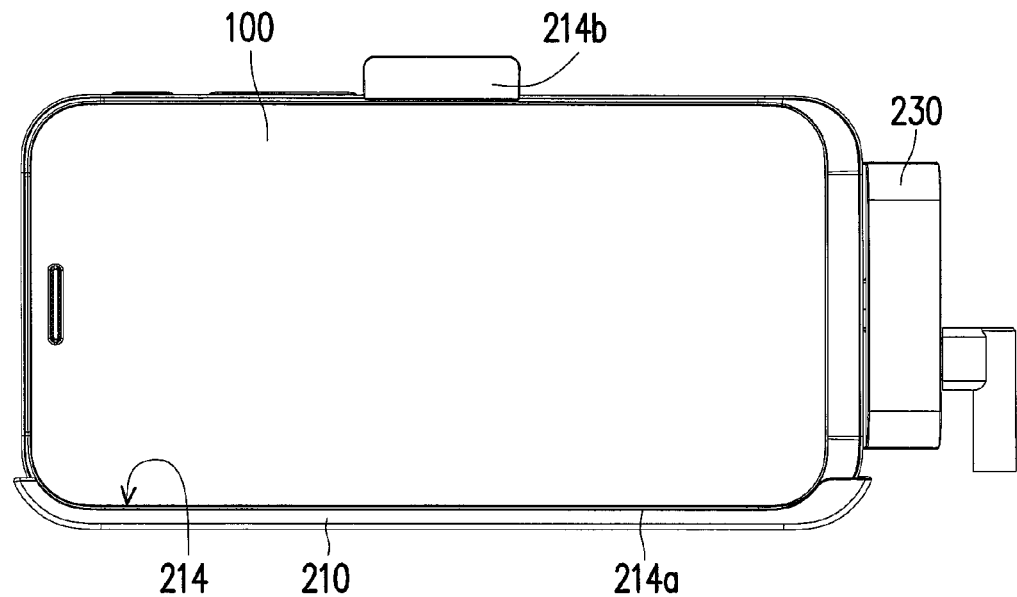
FIG. 3 is a schematic diagram showing that when an electronic device is installed into the electronic device holder in FIG. 1, a moving unit is fixed on a lock position relative to a holder while the electronic device is being charged.
Figure 4:
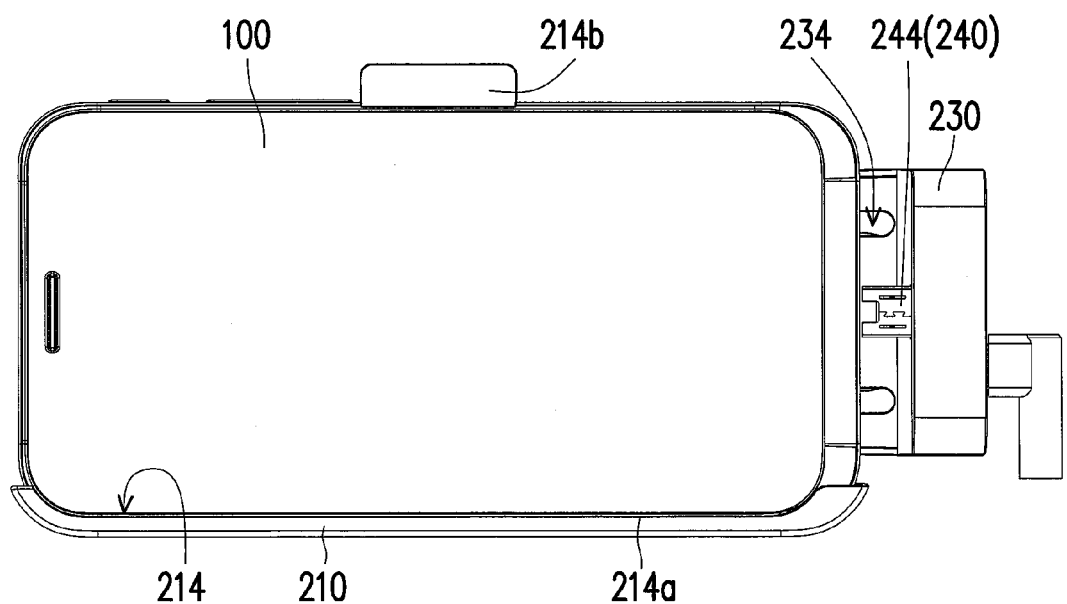
FIG. 4 is a schematic diagram showing that when the electronic device is installed into the electronic device holder in FIG. 1, the moving unit is fixed on an open position relative to the holder while the electronic device is not being charged.
Figure 7:
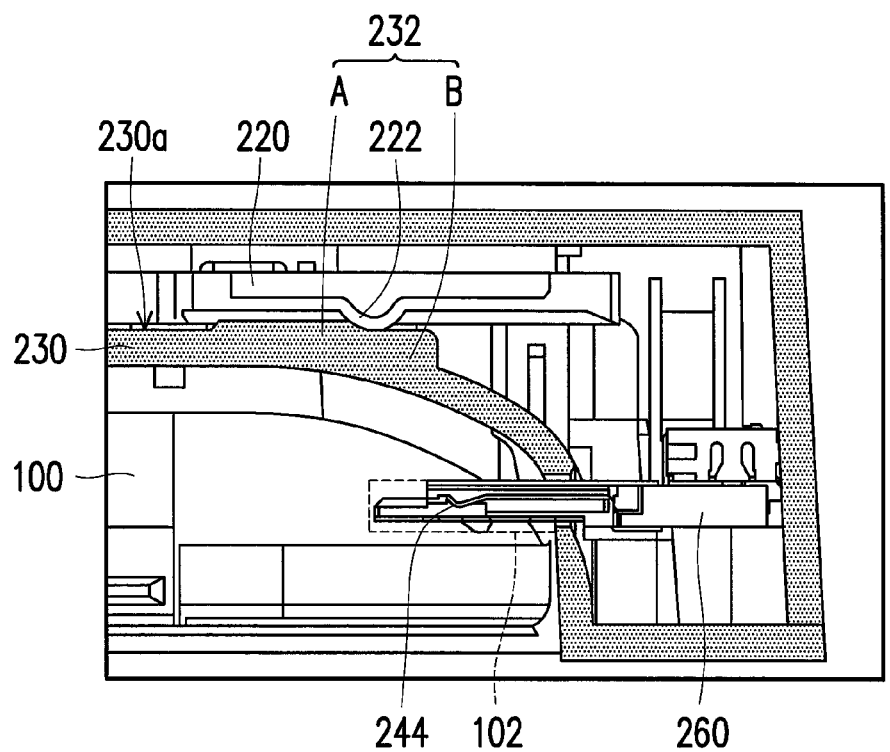
FIG. 7 is a cross-sectional diagram along section line A-A in FIG. 5.

FIG. 1 and FIG. 2 are schematic exploded diagrams of an electronic device holder of the invention from different view angles. FIG. 3 is a schematic diagram showing that when an electronic device is installed into the electronic device holder in FIG. 1, a moving unit is fixed on a lock position relative to a holder while the electronic device is being charged. FIG. 4 is a schematic diagram showing that when the electronic device is installed into the electronic device holder in FIG. 1, the moving unit is fixed on an open position relative to the holder while the electronic device is not being charged. Referring to all of FIG. 1 to FIG. 4, an electronic device holder 200 of the present embodiment is adapted to be fixed on a moving carrier (not illustrated) for holding an electronic device 100. The moving carrier described in the present embodiment is a vehicle, but is not limited thereto, and may be other object with mobility. The electronic device 100 of the present embodiment is a portable phone, and may also be an electronic device providing a display screen during motion of the moving carrier, such as a portable navigation device, an event data recorder or a satellite television, but is not limited to the above. The electronic device holder 200 includes a holder 210, a fixing element 220, a moving unit 230 and at least one first connector 240. The fixing element 220 is fixed above a back surface 212 of the holder 210 and has a first limiting structure 222. The moving unit 230 is disposed between the holder 210 and the fixing element 220, moving relative to the holder 210. The moving unit 230 has a second limiting structure 232, wherein the second limiting structure 232 locks with the first limiting structure 222 for fixing the moving unit 230 on a lock position (as shown in FIG. 3) or an open position (as shown in FIG. 4) relative to the holder 210. The first connector 240 is disposed on the moving unit 230 and is adapted to connect with a second connector 102 (as shown in FIG. 7) of the electronic device 100 when the moving unit 230 is located on the lock position relative to the holder 210.

Following the above, the holder 210 has a carrier space 214 on a side opposite to a side where the back surface 212 is located, and the electronic device 100 is disposed in the carrier space 214. In detail, a side wall 214a of the holder 210 surrounding below the carrier space 214 is slightly arc-shaped for ease of holding the electronic device 100. Furthermore, a side wall 214b located above the carrier space 214 is fabricated to have a shape of a spring arm with its end extending slightly upward, allowing a user to easily detach the electronic device 100 from the holder 210 by poking aside the end. In addition, a connector jack of the first connector 240 is correspondingly toward the carrier space 214, so that the connector jack is capable of correspondingly connecting with the second connector 102 of the electronic device 100 when the moving unit 230 is located on the lock position.

In the present embodiment, the first limiting structure 222 is an elastic piece, and the second limiting structure 232 is a gradational projection. The gradational projection has two gradations A and B. The gradations A and B form a sharp angle with a surface 230a of the moving unit 230, and extend along a moving direction of the moving unit 230 moving from the lock position to the open position. There are stages at both places where the surface 230a and the gradational projection are connected to each other and where the gradations A and B are connected to each other. Accordingly, when the moving unit 230 moves to the lock position or the open position, the position of the moving unit 230 relative to the holder 210 is limited by the elastic piece engaging with the stages.

In the electronic device holder 200 of the present embodiment, the holder 210 further has a plurality of protruding ribs 216 protruding from the back surface 212. The moving unit 230 has a plurality of openings 234, and the protruding ribs 216 correspondingly penetrate through the openings 234 of the moving unit 230. The openings 234 are approximately ellipse-shaped, and the size of the long axis of the ellipse determines a movable distance of the moving unit 230 relative to the holder 210. The protruding ribs 216 and the openings 234 are disposed in pairs, which means that the protruding ribs 216 are left-right symmetrically disposed with respect to a central axis C, and so are the openings 234. An advantage of making the protruding ribs 216 and the openings 234 disposed in pairs is that the moving unit 230 moves more stably relative to the holder 210. In addition, the electronic device holder 200 further includes a plurality of fastening elements 250. The fastening elements 250 penetrate through the fixing element 220 and are fastened correspondingly into the protruding ribs 216 so as to prevent the moving unit 230 from moving along an axial direction of the protruding ribs 216. The fastening elements 250 used in the present embodiment are screws, but are not limited thereto. Persons skilled in the art may use tenons, tacks, or other suitable elements according to practical requirements, as long as the elements are capable of being assembled with the protruding ribs 216 to prevent the moving unit 230 from moving along the axial direction of the protruding ribs 216.

In the present embodiment, the first connector 240 consists of a female connector head 242 and a male connector head 244 adapted to connect with the electronic device 100. The male connector head 244 and the female connector head 242 are disposed on opposite sides of the moving unit 230. The male connector head 244 and the female connector head 242 are not disposed coaxially, but the male connector head 244 is disposed shiftily with respect to the female connector head 242. Furthermore, the male connector head 244 and the female connector head 242 are electrically connected via a circuit board 260 fixed on the moving unit 230. The above-mentioned example employs the circuit board 260 as a medium of electrically connecting the male connector head 244 to the female connector head 242. However, persons skilled in the art may use a flexible flat cable or other suitable elements as the medium of electrical connection according to practical requirements, and the invention is not limited to the present embodiment. It should be noted that although the present embodiment has been described in terms of the first connector 240 consisting of the male connector head 244 and the female connector head 242, in other embodiments, an integral connector may be employed, and structures or arrangement manners of the other elements have to be modified accordingly.

In addition, the electronic device holder 200 further includes a housing 270 assembled with the moving unit 230. The housing 270 is assembled with the moving unit 230 by screwing, engaging, or tight fitting to protect elements inside the housing 270, such as the circuit board 260 or connectors, and also to mask the internal structure to produce a more uniform appearance.

Figure 5:
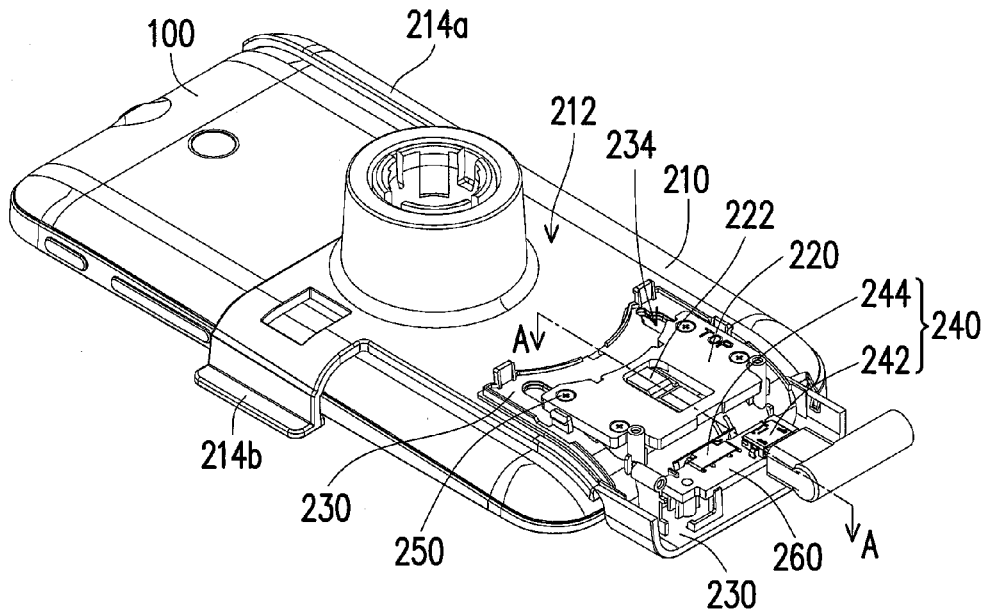
FIG. 5 is a schematic diagram showing that the moving unit is located on the lock position.
Figure 6:
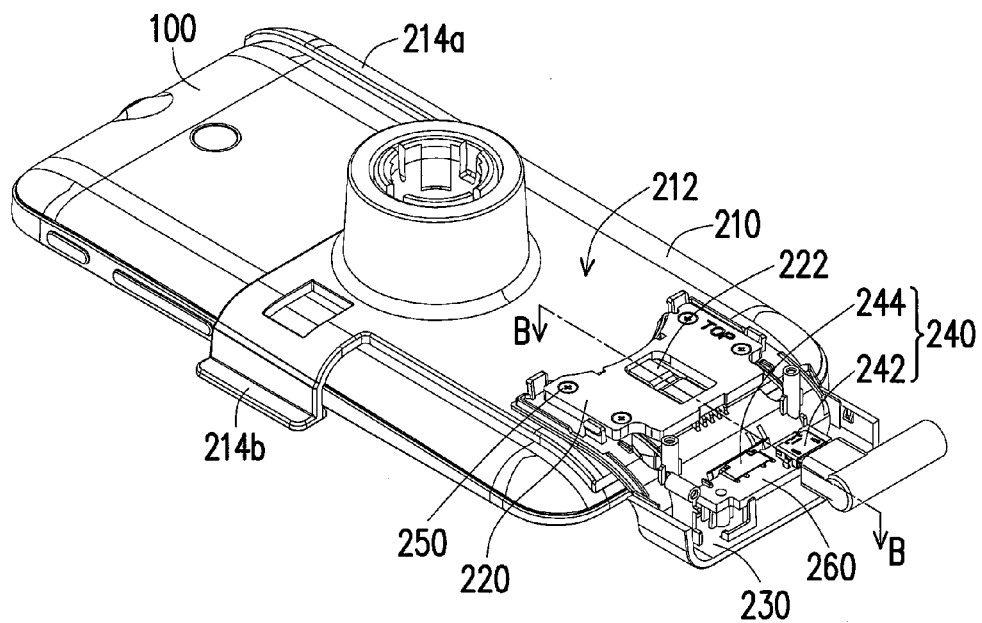
FIG. 6 is a schematic diagram showing that the moving unit is located on the open position.
Figure 8:
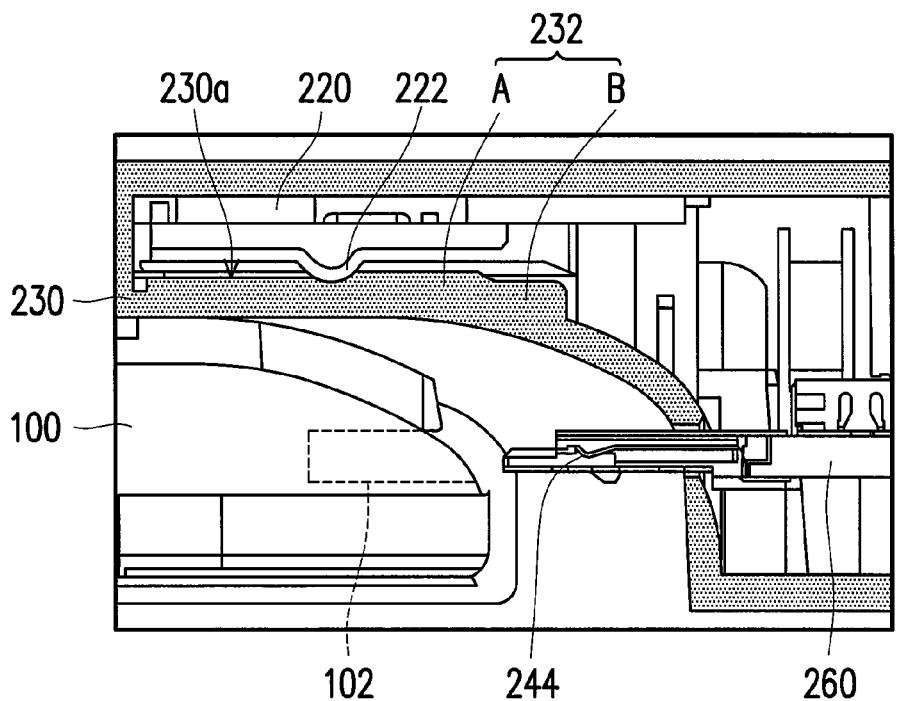
FIG. 8 is a cross-sectional diagram along section line B-B in FIG. 6.

FIG. 5 is a schematic diagram showing that the moving unit is located on the lock position. FIG. 6 is a schematic diagram showing that the moving unit is located on the open position. FIG. 7 is a cross-sectional diagram along section line A-A in FIG. 5. FIG. 8 is a cross-sectional diagram along section line B-B in FIG. 6. Referring to FIG. 3, FIG. 5 and FIG. 7, when the electronic device 100 is assembled on the electronic device holder 200, namely, when the electronic device 100 is held by the holder 210 and the moving unit is located on the lock position, the first limiting structure 222 being the elastic piece is engaged at the place where the gradations A and B of the second limiting structure 232 being the gradational projection are connected to each other. Here, the male connector head 244 of the first connector 240 is deep inside the carrier space 214 and further connects correspondingly with the second connector 102 of the electronic device 100. By the corresponding connection between the first connector 240 and the second connector 102, the electronic device holder 200 charges the electronic device 100.

Next, referring to FIG. 4, FIG. 6 and FIG. 8, when the electronic device 100 is completely charged, or when the user decides to stop charging the electronic device 100, the user may push the moving unit 230 to cause the moving unit 230 to move from the lock position to the open position. Here, the first limiting structure 222 being the elastic piece is located at the place where the gradation A and the surface 230a are connected to each other, and is limited by the gradation A to fix the moving unit 230 on the open position. With changes in position of the moving unit 230, the first connector 240 is released from the connection with the second connector 102 (the position limitation to the electronic device 100 by the first connector 240 is removed). After that, the user may leave the electronic device 100 installed into the electronic device holder 200 (in the meantime, the electronic device holder 200 only acts as a holder for the electronic device 100), or may easily detach the electronic device 100 from the electronic device holder 200.

When the user intends to resume charging the electronic device 100 installed into the electronic device holder 200, the moving unit 230, first on the open position as shown in FIG. 8, is pushed to reach the lock position as shown in FIG. 7. The first connector 240 connects again with the second connector 102 of the electronic device 100. In the meantime, the electronic device holder 200 not only holds the electronic device 100, but also charges the electronic device 100.

From the above, it is known that the electronic device holder 200 of the present embodiment, by being provided with the moving unit 230 having connectors disposed thereon, integrates functions of holding and charging the electronic device 100. Accordingly, not only the number of accessories is decreased, but also convenience in use is enhanced.

Figure 9:
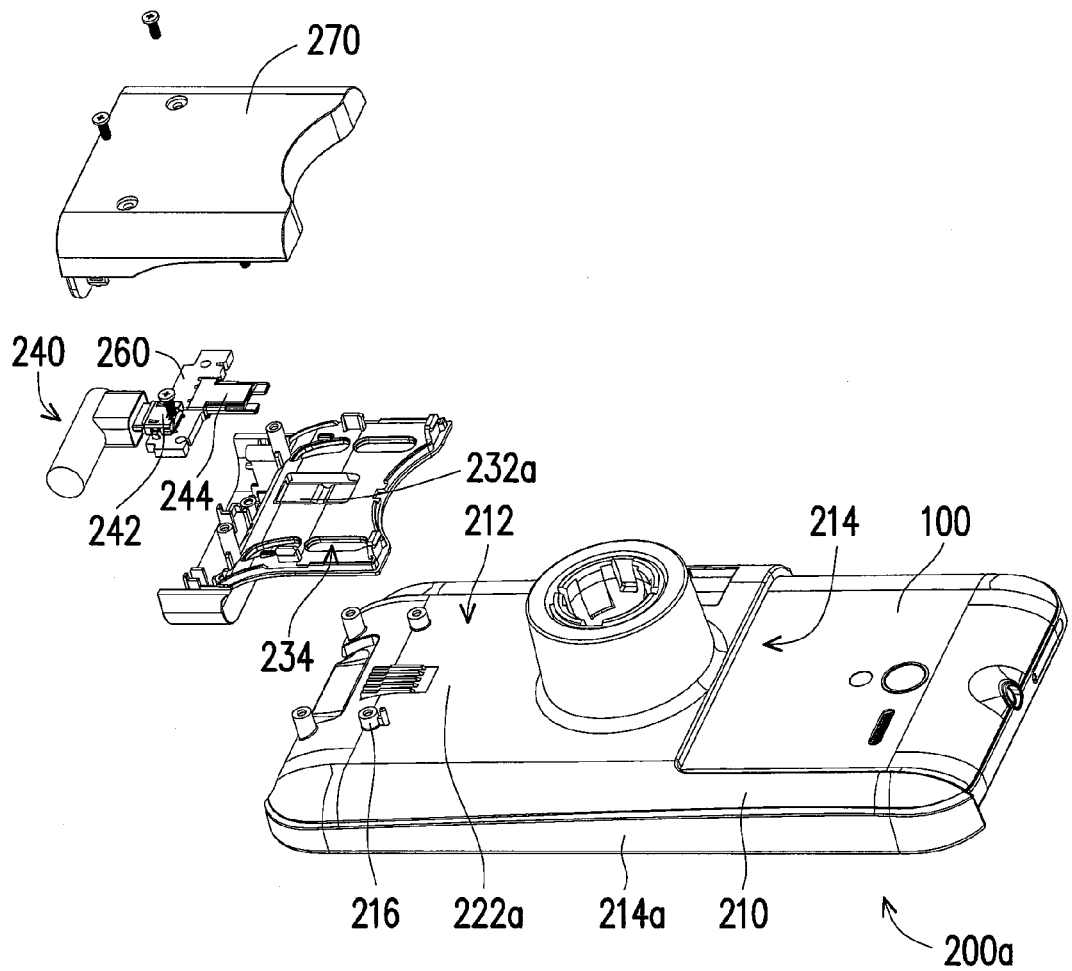
FIG. 9 is a schematic exploded diagram of the electronic device holder according to another embodiment of the invention.

FIG. 9 is a schematic exploded diagram of the electronic device holder according to another embodiment of the invention. The present embodiment is approximately identical to the aforementioned embodiments, and the same or similar elements are provided with the same or similar reference numerals. Referring to FIG. 9, a difference between the aforementioned embodiments and the present embodiment is that the fixing element 220 is omitted in the present embodiment, and the positions of a first limiting structure 222a and a second limiting structure 232a are changed accordingly. In detail, the first limiting structure 222a is disposed on the back surface 212 of the holder 210, and the second limiting structure 232a is disposed on the moving unit 230.

It should be noted that in the present embodiment, since the first limiting structure 222a is disposed on the back surface 212 of the holder 210, the first limiting structure 222a is preferably a gradational projection, while the second limiting structure 232a is especially preferably an elastic piece. The reason is that in cases where the elastic piece is disposed on the back surface 212 of the holder 210, when the electronic device 100 is disposed into the holder 210, it is very possible that the elastic piece pushed by the gradational projection of the moving unit 230 will push the electronic device 100 to cause the electronic device 100 to easily drop off from the holder 210. Based on this consideration, to make the first limiting structure 222a a gradational projection and the second limiting structure 232a an elastic piece is a better arrangement.

Regarding the moving manner of the moving unit 230 relative to the holder 210, the engagement relationship between the elastic piece and the gradational projection, the disposing manner of the first connector 240, the connecting manner between the first connector 240 and the second connector 102, and other variable manners, the descriptions thereof have been given in the aforementioned embodiments. Furthermore, persons skilled in the art may obtain the usage and operating manner of an electronic device holder 200a of the present embodiment by referring to the descriptions of the aforementioned embodiments. Therefore, the details will not be repeated herein. In addition, since the fixing element for preventing the moving unit 230 from moving along the axial direction of the protruding ribs 216 is omitted, whether a corresponding structure may be fabricated inside the housing 270 to achieve the same effect, or an appropriate choice of the fastening element 250 may be made according to such need.

In summary, the electronic device holder of the invention integrates a holder with a connector. By utilizing the position of the moving unit relative to the holder, the effects that the holder only holds the electronic device but not charge it and that the holder charges the electronic device while holding it at the same time are both achievable. Therefore, compared to the prior art in which the conventional car mount and charging cable are two independent accessories, the electronic device holder of the invention not only decreases the number of accessories, but also enhances convenience in use.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An electronic device holder adapted to be fixed on a moving carrier for holding an electronic device, comprising:
   a holder;
   a fixing element fixed above a back surface of the holder and having a first limiting structure;
   a moving unit disposed between the holder and the fixing element, moving relative to the holder, the moving unit having a second limiting structure, wherein the second limiting structure locks with the first limiting structure for fixing the moving unit on a lock position or an open position relative to the holder; and
   at least one first connector disposed on the moving unit and adapted to connect with a second connector of the electronic device when the moving unit is located on the lock position relative to the holder, wherein the holder has a carrier space on a side opposite to a side where the back surface is located, the electronic device is disposed in the carrier space, the first limiting structure is one of a gradational projection and an elastic piece, and the second limiting structure is the other one of the gradational projection and the elastic piece.

2. The electronic device holder of claim 1, wherein a connector jack of the first connector is correspondingly toward the carrier space.

3. The electronic device holder of claim 1, wherein the holder further has a plurality of protruding ribs protruding from the back surface, the moving unit has a plurality of openings, and the protruding ribs correspondingly penetrate through the openings of the moving unit.

4. The electronic device holder of claim 3, wherein the protruding ribs and the openings are disposed in pairs.

5. The electronic device holder of claim 3, further comprising a plurality of fastening elements penetrating through the fixing element and fastened into the protruding ribs.

6. The electronic device holder of claim 1, wherein the first connector comprises a male connector head and a female connector head disposed on opposite sides of the moving unit, the male connector head is electrically connected to the female connector head, and the male connector head is adapted to connect with the electronic device.

7. The electronic device holder of claim 6, further comprising a circuit board or a flexible flat cable fixed on the moving unit, the male connector head being electrically connected to the female connector head via the circuit board or the flexible flat cable.

8. The electronic device holder of claim 1, further comprising a housing assembled with the moving unit.

* * * * *